United States Patent [19]

Shieh et al.

[11] Patent Number: 4,990,466
[45] Date of Patent: Feb. 5, 1991

[54] METHOD FOR FABRICATING INDEX-GUIDED SEMICONDUCTOR LASER

[75] Inventors: Chan-Long Shieh, Plainsboro, N.J.; Joseph I. Mantz, Pipersville, Pa.; Reinhard W. H. Engelmann, Pennington, N.J.

[73] Assignee: Siemens Corporate Research, Inc., Princeton, N.J.

[21] Appl. No.: 265,644

[22] Filed: Nov. 1, 1988

[51] Int. Cl.$^5$ .................. H01L 21/20; H01L 21/265
[52] U.S. Cl. .................. 437/129; 148/DIG. 95; 372/16; 437/22; 437/26; 437/133; 437/936
[58] Field of Search .................. 148/DIG. 3, 31, 55, 148/56, 65, 72, 76, 95, 102, 158, 169, 33, 33.2, 33.4, 33.5; 156/610–614; 357/16, 17; 372/43, 44, 45, 46, 50; 437/81, 97, 22, 26, 105, 107, 108, 110, 126, 129, 133, 247, 936, 958, 987

[56] References Cited

U.S. PATENT DOCUMENTS

| | | | |
|---|---|---|---|
| 4,809,288 | 2/1989 | Welch et al. | 372/45 |
| 4,845,725 | 7/1989 | Welch et al. | 372/46 |
| 4,849,080 | 7/1989 | Doorman et al. | 204/192.3 |
| 4,875,216 | 10/1989 | Thornton | 372/45 |

OTHER PUBLICATIONS

"Stripe-Geometry AlGaAs-GaAs Quantum-Well Heterostructure Lasers Defined by Impurity-Induced Layer Disordering" by K. Meehan et al., Appl. Phys. Lett., vol. 44, No. 7, pp. 700–702; 1 Apr. 1984.
"Diffusion and Electrical Properties of Silicon Doped Gallium Arsenide" by M. E. Greiner et al., J. Appl. Phys., 1985, pp. 5181–5187.
"Diffusion of Silicon in Gallium Arsenide Using Rapid Thermal Processing: Experiment and Model", M. E. Greiner et al., Appl. Phys. Lett. 1984, 44, pp. 750–752.
"Closed Tube Diffusion of Silicon in GaAs from Sputtered Silicon Film", E. Omura et al., Electron. Lett., 1986, pp. 496–498.
"Chemical Preparation of GaAs Surfaces and Their Characterization by Auger Electron and X-Ray Photoemission Spectroscopies", C. C. Chang et al., J. Vac. Sci. Techno. 1977, 14, 943–952.
"Stripe-Geometry Quantum Well Heterostructure $Al_x$-$Ga_{1-x}As$ GaAs Defined by Defect Diffusion", D. G. Deppe et al., Appl. Phys. Lett., vol. 49, No. 9, 1 Sep. 1986.
"Gallium Arsenide Technology", David K. Ferry; 1985, Howard W. Sames and Co. Inc., Indianapolis, Indiana.
Kawabe et al., "Control of Compositioinal Disordering by Ar Ion Implantation", Extended Abstracts of the 18th Conf. Solid State Devices and Mat., Tokyo, 1986, pp. 607–610.
Sze, *VLSI Technology*, McGraw-Hill, New York, 1983, pp. 219, 220 and 318.

*Primary Examiner*—Olik Chaudhuri
*Assistant Examiner*—William D. Bunch
*Attorney, Agent, or Firm*—Adel A. Ahmed

[57] ABSTRACT

A method of altering a refractive index, as for an optical waveguide, as in a buried heterostructure laser, by inducing disordering in a region of a semiconducotr body comprises exposing a surface portion of the semiconductor body to plasma etching, coating at least a part of the surface portion with an oxide layer, heat treating the semiconductor body.

17 Claims, 4 Drawing Sheets

METHOD FOR FABRICATING INDEX-GUIDED SEMICONDUCTOR LASER

The present invention relates to semiconductor devices and, more particularly, to optoelectronic devices such as semiconductor lasers and optical waveguides using, for example, gallium arsenide.

In the manufacture of solid state or semiconductor optoelectronic devices it is desirable to be able to fabricate planar optical waveguide structures. Etching may be utilized to create a waveguide but the resulting structure is then no longer planar. However, such waveguide structures may be realized by forming a region having an index of refraction different from that of an adjacent region. Using so-called "index guidance", light tends to be guided within a material exhibiting a higher index of refraction than that of the adjacent neighboring material. Suitable modification of the refractive index has in the past been achieved by impurity induced disordering, also referred to as "averaging" or "mixing" in a crystalline structure, typically an epitaxial quantum-well heterostructure such as may be utilized in the fabrication of a buried heterostructure laser. Generally, the effect of such disordering is to increase the effective bandgap potential of the quantum well heterostructure to a value similar to that of the disordered alloy bulk single crystal. Thus, material not having undergone disordering and exhibiting a relatively lower bandgap potential generally exhibits a relatively higher refractive index than material that has undergone disordering. Further details of such procedures are described in, for example, an article entitled "Stripe-geometry AlGaAs-GaAs quantum-well heterostructure lasers defined by impurity-induced layer disordering" by K. Meehan, J. M. Brawn, N. Holonyak, Jr., R. D. Burnham, T. L. Paoli, and W. Streifer, Appl. Phys. Lett. Vol. 44, No. 7, pp. 700–702; Apr. 1, 1984. It is herein also recognized that a relatively lower bandgap potential may be desirable in a local region of such semiconductor devices since it tends to result locally in a relatively higher current density, as may be found desirable in the construction of a buried heterojunction laser for providing a relatively high useful light output at a low current level. A relatively lower bandgap potential in a local region can be obtained by raising the bandgap potential outside that local region.

While impurity induced disordering has found application in the integration of optoelectronic devices and, more particularly, in the fabrication of buried heterojunction lasers, such impurity induced disordering typically requires a relatively high impurity concentration. Generally, such relatively high impurity concentrations tend to result in a relatively large free carrier concentration and thereby in relatively strong free carrier absorption of light. This is generally undesirable and may be a limiting factor in the application of such techniques particularly to passive optical devices where losses tend to be of critical concern. Furthermore, the electric fields in such devices tend to be non-uniform and depletion layers tend to be more narrow and to exhibit greater capacitance, thereby reducing speed.

Alternatively, disordering resulting from dielectric capping without the need for impurity diffusion has been employed in place of impurity induced disordering. Further details of such procedures are described in, for example, an article entitled "Stripe-geometry quantum well heterostructure $Al_xGaAs_{1-x}$ lasers defined by defect diffusion" by D. G. Deppe, L. J. Guido, N. Holonyak, Jr., K. C. Hsieh, R. D. Burnham, R. L. Thornton, and T. L. Paoli, Appl. Phys. Lett., Vol. 49, No. 9, Sept. 1, 1986. A dielectric capping material such as silicon dioxide tends to induce disordering by introducing defects. However, since thermal processing is utilized in this process, changes due to thermal annealing also occur to some degree in regions not subject to the capping material. Since the rate of defect induced disordering by dielectric capping is relatively slow, such annealing effects are exacerbated by the relatively long application of high temperature required for this approach. Such effects are typically not well tolerated in quantum well devices.

In accordance with a first aspect of the invention, a method of inducing disordering or layer averaging in a region of a multi-heterojunction semiconductor body, comprises the steps of:
(a) exposing a predetermined surface portion of the semiconductor body to plasma or ion beam etching;
(b) coating at least a part of the surface portion with an oxide layer; and
(c) heat treating the semiconductor body.

In accordance with a second aspect of the invention, a method of altering the refractive index in a portion of a semiconductor body, where the semiconductor body generally exhibits a refractive index of a first value, comprises:
(a) exposing a predetermined surface portion of the semiconductor body to plasma etch;
(b) coating at least a part of the surface portion with an oxide layer; and
(c) heat treating the semiconductor body such that the portion of the semiconductor body exhibits a refractive index of a second value, different from the first value.

In accordance with a third aspect of the invention, a method of fabricating an optical waveguide in a selected portion of a quantum well heterostructure region in a semiconductor body comprises the steps of:
(a) masking a first portion of a surface of the semiconductor body so as to leave unmasked a second portion, said first portion corresponding substantially with the selected portion of a quantum well heterostructure region so as to provide shielding thereto;
(b) exposing the surface of the semiconductor body to a sputter etch;
(c) coating the surface with a layer of silicon dioxide; and
(d) subjecting the semiconductor body to heat treatment.

In accordance with a fourth aspect of the invention, a method of fabricating an optical waveguide in a selected portion of a quantum well heterostructure region in a semiconductor body comprises the steps of:
(a) exposing to a sputter etch a portion of a surface of the semiconductor body associated with the selected portion;
(b) applying a coat of silicon dioxide to the portion of a surface; and
(c) heat treating the semiconductor body.

In accordance with a fifth aspect of the invention, the sputter etch in any of the foregoing aspects is an argon sputter etch.

In accordance with a sixth aspect of the invention, a method of fabricating a buried heterostructure semiconductor laser structure on a gallium arsenide substrate, wherein the laser structure includes an optical waveguide structure, comprises the steps of:

(a) forming a first aluminum gallium arsenide layer over the substrate;

(b) forming a multi quantum well layer over the first aluminum gallium arsenide layer;

(c) forming a second aluminum gallium arsenide layer over the multi quantum well layer;

(d) forming a semiconducting contact layer over the second aluminum gallium arsenide layer;

(e) masking a first portion of the contact layer with silicon nitride so as to leave a second portion unmasked;

(f) removing the second portion of the contact layer so as to expose an underlying portion of the second aluminum gallium arsenide layer;

(g) exposing the semiconductor body on a side remote from the substrate to an argon plasma etch; and (h) forming a layer of silicon dioxide over the side having been exposed to the argon plasma etch.

In accordance with a seventh aspect of the invention, a method of fabricating an optical waveguide in a selected portion of a quantum well heterostructure region in a semiconductor body, comprises the steps of:

(a) masking a first portion of a surface of said semiconductor body corresponding substantially with said selected portion of a quantum well heterostructure region so as to provide shielding thereto;

(b) exposing said surface of said semiconductor body to an argon sputter etch while forming thereon a layer of silicon dioxide; and (c) subjecting said semiconductor body to heat treatment.

The invention will be best understood from the detailed description following, with the aid of the drawings, in which FIGS. 1-6 show embodiments in accordance with the invention;

None of the figures is drawn to scale. Like numerals generally identify similar parts in the various figures.

Figure 1:
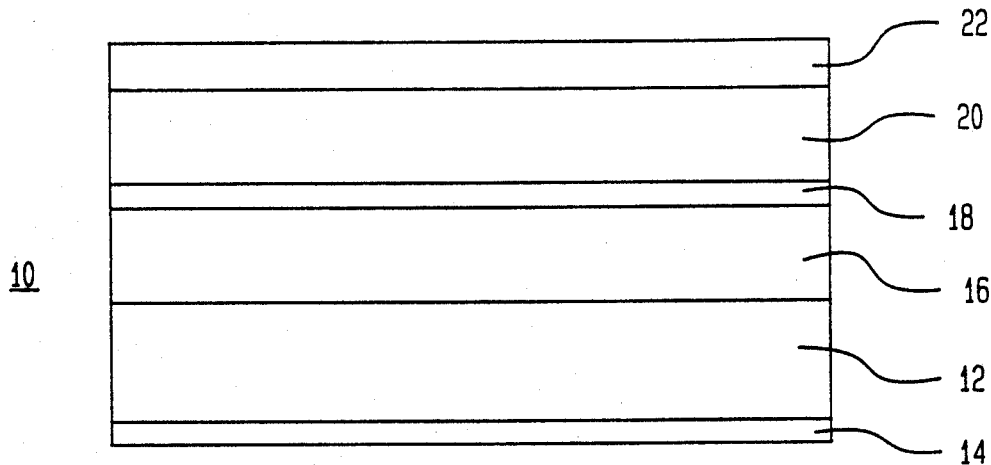

FIG. 1 shows a semiconductor arrangement 10 in which 12 is a substrate layer of gallium arsenide. A contact layer 14 is provided on the bottom side of substrate 12. Contact layer 14 can typically be added in a subsequent step and may be of any suitable composition, for example Au-Ge/Ni/Au. On the upper side of substrate layer 12 is a layer 16 referred to as a "clad" layer of aluminum gallium arsenide. The next layer above layer 16 is a multi quantum well layer 18, in which quantum wells are grown in a known manner, separated by barriers such as of aluminum gallium arsenide or aluminum arsenide. Multi quantum well layer 18 is preferrably not intentionally impurity doped, although it may contain some residual doping level, typically a low p level and generally having an impurity concentration less than $10^{14}$ centimeter. The junction between layers 16 and 18 typically forms the operating junction for a laser. Thus, it is desirable to have a low band gap in the active region of multi quantum well layer 18 and to form a waveguide for light generated in this portion.

Above layer 18 is a second clad layer 20 of aluminum gallium arsenide, and above layer 20 is a contact layer 22 of gallium arsenide. In the present described exemplary embodiment in accordance with the invention, substrate layer 12 and clad layer 16 are both n-doped, whereas multi quantum well layer 18 is not intentionally doped, as has been explained above. Clad layer 20 is p-doped and contact layer 22 is heavily p-doped for contacting purposes.

Figure 2:
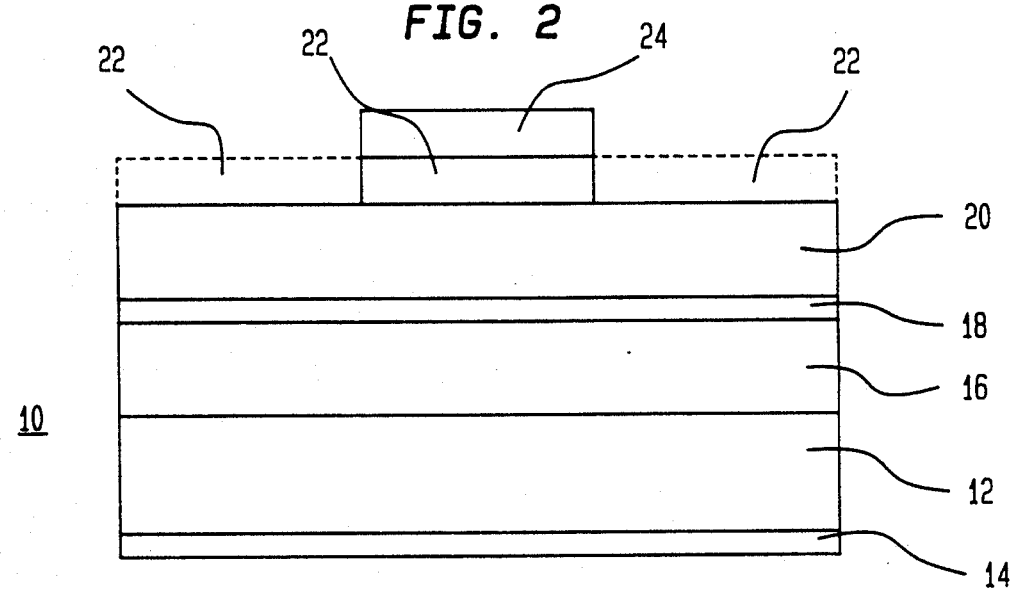
Figure 3:
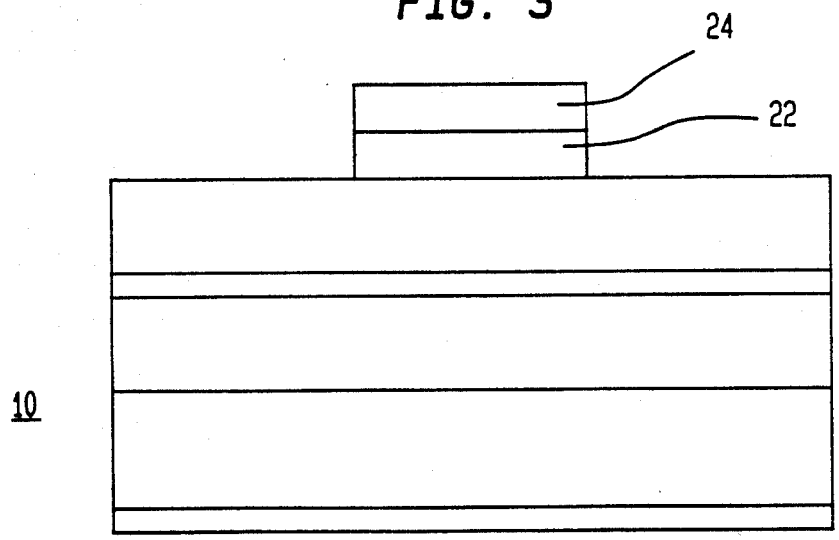

In accordance with the step shown in FIG. 2, a layer 24 of silicon nitride is formed on layer 22. Layer 24 is typically delineated by a photomask process. At this stage, portions of layer 22 which are not under layer 24 are removed, although this is not essential and layer 22 is indicated in FIG. 2 in the alternative by dashed lines. For the purposes of the present description, layer 22 is taken to be coextensive with layer 24, as illustrated in FIG. 3.

Figure 4:
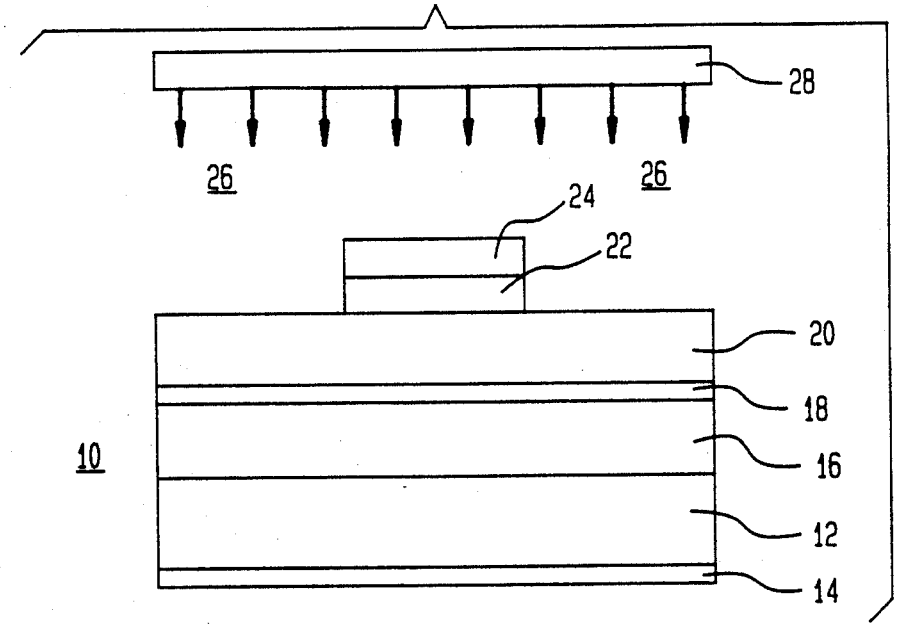
Figure 5:
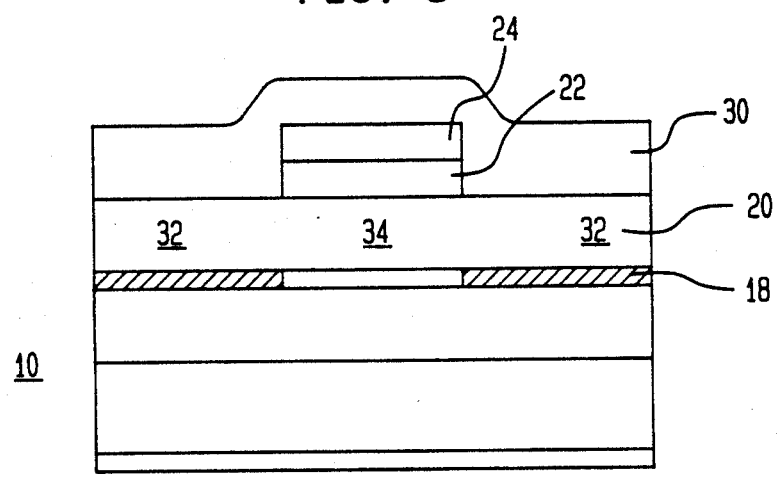
Figure 6:
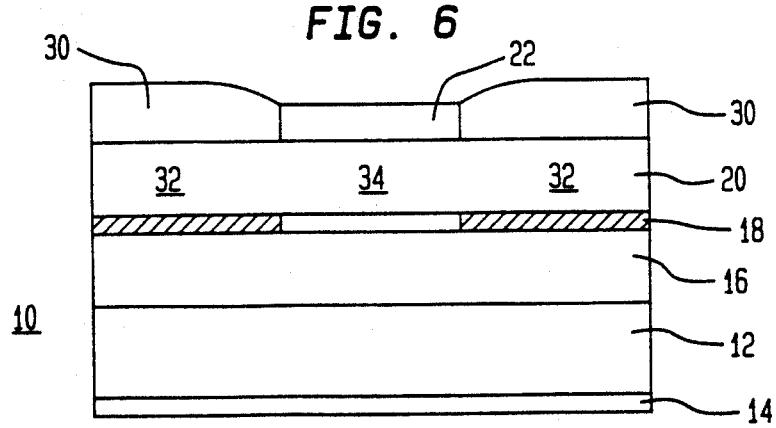

In FIG. 4, the semiconductor arrangement is subjected to a low energy argon sputter, generally indicated as 26, provided by an argon plasma source 28. The substrate bias employed in the argon sputter etch is relatively low, being typically in the order of 25 volts. The sputter etch is believed to bring about surface changes, primarily in the areas not shielded by layer 24. Thereafter, as illustrated in FIG. 5, a layer 30 of silicon dioxide is formed over the whole, for example, by sputtering silicon in an oxygen atmosphere. The arrangement is then subjected to heat treatment at a temperature similar to that utilized for silicon diffusion, that is, typically 850° C. for a period of up to several hours. It is then found that portions of multi quantum well layer 18 not shielded by silicon nitride layer 24 from the argon plasma sputter have undergone disordering, also referred to as averaging or mixing. This is believed to be due, at least in part, to the migration of vacancies from clad layer 20 into multi quantum well layer 18 in areas corresponding to surface portions where changes have been caused by the argon plasma sputter. While some degree of disordering may also occur in the shielded portion of multi quantum well 18, this is small in comparison with the disordering of the unshielded portion. Thereafter, as illustrated in FIG. 6, silicon dioxide layer 30 is removed over layer 24 which is then itself removed to leave contact layer 22 exposed. Those portions of multi quantum well layer 18 which are not underneath silicon nitride layer 22 and have consequently been disordered, are indicated in FIGS. 5 and 6 by crosshatched portions 32. Portions 32 of multi quantum well layer 18 consequently exhibit a higher band gap and a lower index of refraction in comparison with a portion 34 of multi quantum well layer 18 which has been shielded. Accordingly, portion 34 which exhibits a relatively high index of refraction as compared with its neighboring portions, functions as a waveguide for light energy therein. Furthermore, the lower band gap value for portion 34 tends to enhance current flow in that portion of the junction including portion 34, such that laser efficiency and operation at low current levels are enhanced.

Figure 7:
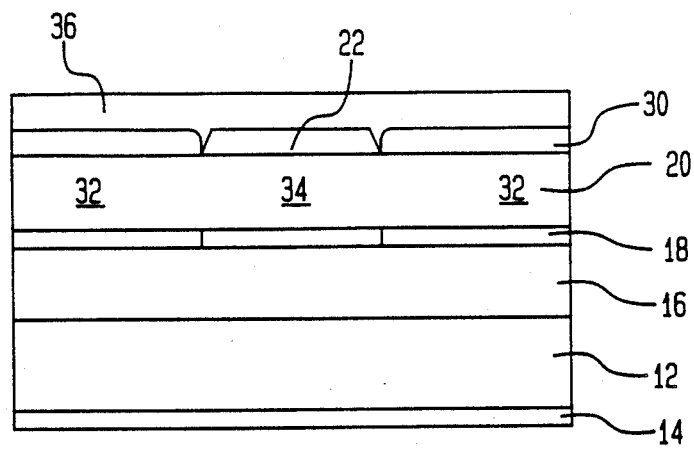
FIG. 7 shows a device in accordance with the principles of the invention.

In FIG. 7, a completed structure is shown, further including a layer of metallization 36 which typically may be of a titanium, platinum, and gold structure.

Figure 9:
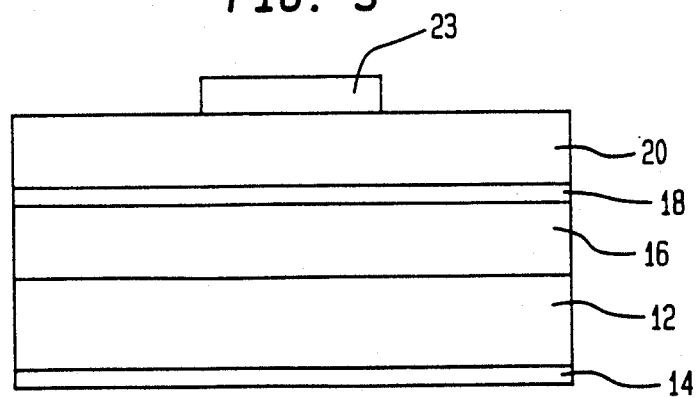
FIGS. 9-12 show a further embodiment in accordance with the invention.
Figure 10:
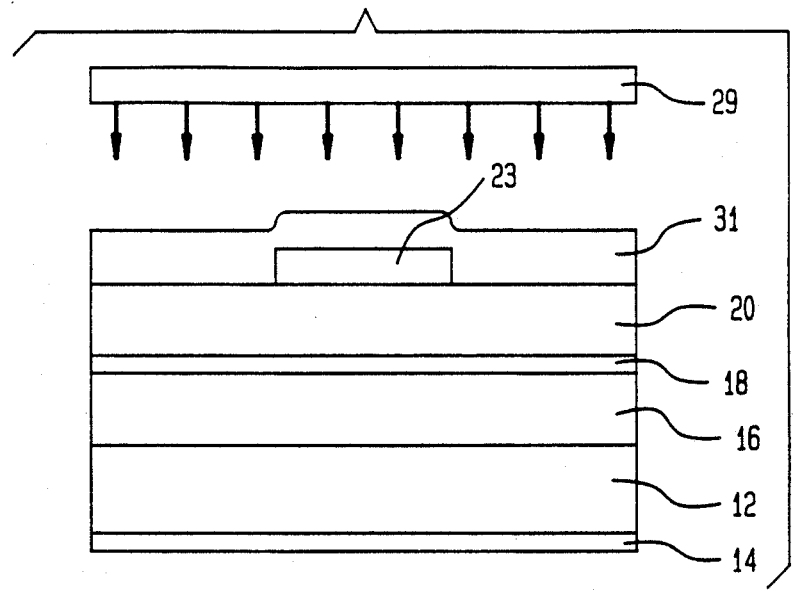
Figure 11:
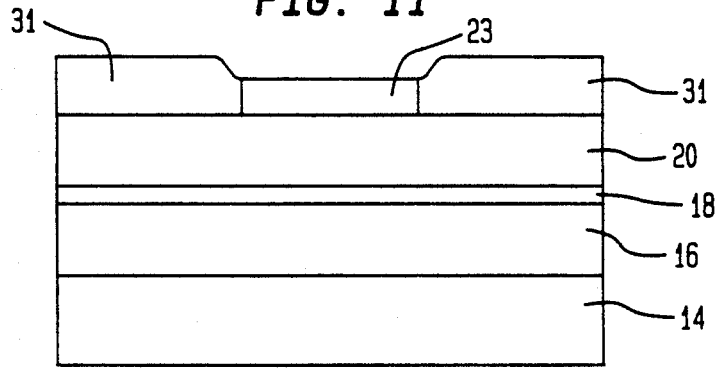
Figure 12:
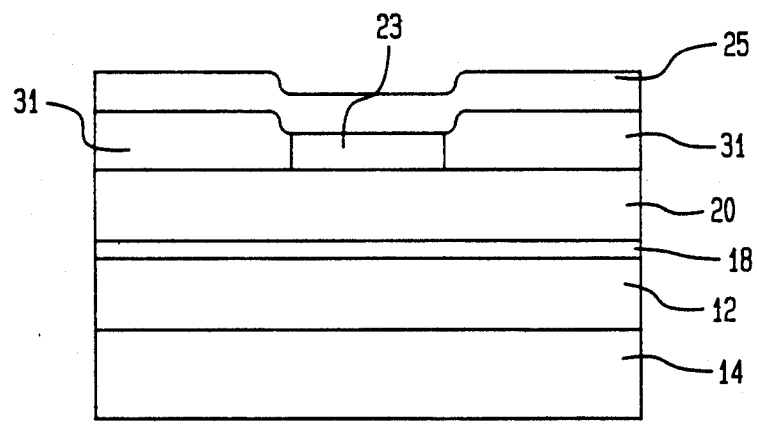

The process can be varied so as to implement a self-aligned contact index guided buried heterostructure laser by disordering through a combination of sputter etch and the deposition of silicon dioxide. Referring to FIG. 9, a narrow stripe is defined by photolithography on gallium arsenide contact layer 22. Layer 22 is then etched away outside the narrow stripe, as shown in FIG. 9, so as to leave a contact stripe 23. Simultaneously, the sample is subjected to an argon sputter etch and to a deposition of silicon dioxide by a source 29, so as to form a silicon dioxide layer 31, as shown in FIG. 10. Thereafter, the silicon dioxide is removed from the top of the stripe, leaving silicon dioxide layer 31 on the remainder of the surface, as shown in FIG. 11. A layer of silicon nitride 25 is then deposited over the whole surface as shown in FIG. 12. The sample is thereafter subjected to heat treatment. Relatively rapid disordering results in portions having been subjected to the sputter etch and being covered with silicon dioxide, that is, in portions outside the stripe area. The stripe portion not exposed to silicon dioxide tends to undergo substantially no disordering.

Silicon nitride layer 25 can next be removed so as to leave the silicon dioxide in place as an insulator, enabling current to be confined to the stripe.

Figure 8:
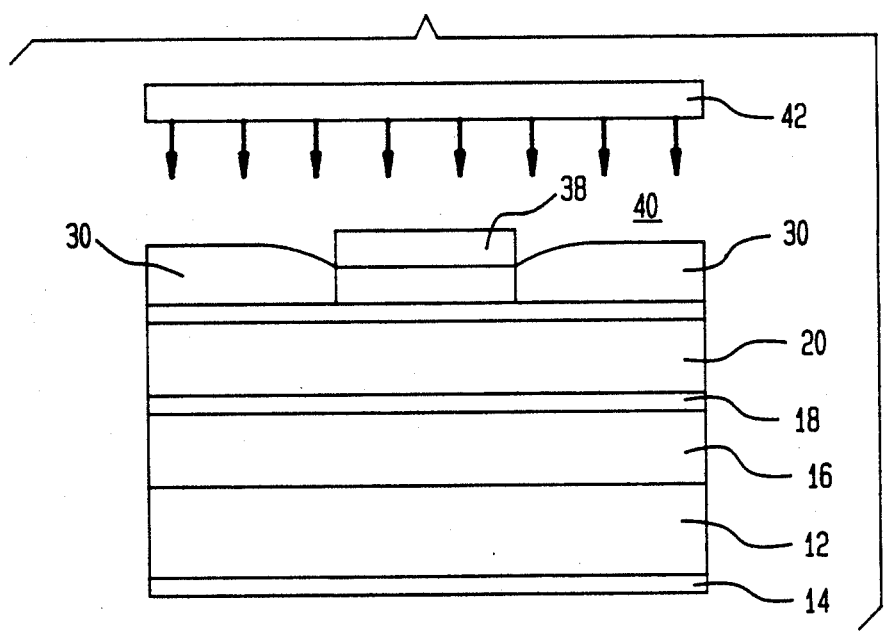
FIG. 8 shows an embodiment illustrating a further aspect of the invention.

It is desirable that the material adjoining the waveguide be of relatively high resistivity. This reduces the effective value of the parasitic lateral capacitance of the waveguide and practically eliminates lateral current spreading. The process described in accordance with the invention makes it possible to achieve this result in a number of possible ways; however, it is particularly convenient to electroplate a layer of gold 38 onto gallium arsenide contact 22 after removal of the nitride layer 24 and thereafter to perform proton implantation 40 in a conventional manner from a proton source 42 as shown in FIG. 8. The proton implant is made deep, e.g. reaching to below multi quantum well layer 18. Thus, where no shielding is afforded by gold layer 38, the proton layer renders semi-insulating clad layers 16 and 20 which, it will be recalled, are impurity-doped. The area under gold layer 38, corresponding to portions adjacent region 34, is shielded from the proton implant and undergoes no significant changes.

While the invention has been described in terms of preferred exemplary embodiments, it is understood that variations are possible. Thus, for example, while an argon sputter etch is preferred, it is recognized that other substances may be utilized, preferrably substances that will not react appreciably, as contrasted with, for example, oxygen. Such variations and substitutions will be apparent to one of skill in the art, and can be implemented without departing from the teaching of the invention which is intended to be limited only by the scope of the claims following.

We claim:

1. A method of fabricating an optical waveguide in a selected portion of a quantum well heterostructure region in a semiconductor body, comprising the steps of:
   (a) masking a first portion of a surface of said semiconductor body corresponding substantially with said selected portion of a quantum well heterostructure region so as to provide shielding thereto:
   (b) exposing unmasked portions of said surface of said semiconductor body to a sputter etch;
   (c) coating said surface with a layer of silicon dioxide; and
   (d) subjecting said semiconductor body to heat treatment, wherein said semiconductor body comprises:
   a first layer of gallium arsenide;
   a second layer of aluminum gallium arsenide overlying said first layer;
   a third layer overlying said second layer and including therein a multi-quantum well structure;
   a fourth layer of aluminum gallium arsenide;
   a fifth layer of gallium arsenide overlying at least said first portion of a surface of said semiconductor body; and
   a sixth layer of silicon nitride overlying at least a portion of said fifth layer so as to mask said first portion of a surface of said semiconductor body.

2. A method of fabricating an optical waveguide as recited in claim 1 wherein said first and second layers are of a first conductivity type and said fourth and fifth layers are of a second conductivity type.

3. A method of fabricating an optical waveguide as recited in claim 2 wherein said first conductivity is n and said second conductivity type is p.

4. A method of fabricating an optical waveguide as recited in claim 3 wherein said heat treatment brings about disordering in said third layer.

5. A method of fabricating an optical waveguide as recited in claim 4 wherein said sputter etch enhances said disordering in a portion of said quantum well heterostructure corresponding to said second portion of a surface of said semiconductor body.

6. A method of fabricating an optical waveguide as recited in claim 5 wherein said sputter etch is an argon sputter etch.

7. A method of fabricating an optical waveguide as recited in claim 6 wherein said argon sputter etch is provided by an argon plasma at a sustaining voltage in the range of 15 volts to 30 bolts.

8. A method of fabricating an optical waveguide as recited in claim 1, comprising the steps of:
   removing said sixth layer of silicon nitride;
   plating a shield layer in place of said sixth layer; and
   implanting protons to a level below said third layer.

9. A method of fabricating an optical waveguide as recited in claim 2 comprising the steps of:
   removing said sixth layer of silicon nitride;
   plating a shield layer in place of said sixth layer; and
   implanting protons to a level below said third layer.

10. A method of fabricating an optical waveguide as recited in claim 4 comprising the steps of:
    removing said sixth layer of silicon nitride;
    plating a shield layer in place of said sixth layer; and
    implanting protons to a level below said third layer.

11. A method of fabricating an optical waveguide as recited in claim 4 comprising the steps of:
    removing said sixth layer of silicon nitride;
    plating a shield layer in place of said sixth layer; and
    implanting protons to a level below said third layer.

12. A method of fabricating an optical waveguide as recited in claim 5 comprising the steps of:
    removing said sixth layer of silicon nitride;
    plating a shield layer in place of said sixth layer; and
    implanting protons to a level below said third layer.

13. A method of fabricating an optical waveguide as recited in claim 6 comprising the steps of:
    removing said sixth layer of silicon nitride;
    plating a shield layer in place of said sixth layer; and
    implanting protons to a level below said third layer.

14. A method of fabricating an optical waveguide in a selected portion of a quantum well heterostructure region in a semiconductor body comprising the steps of:
    (a) selectively exposing to a sputter etch a portion of a surface of said semiconductor body associated with portions of said quantum well heterostructure adjoining said selected portion;

(b) applying a coat of silicon dioxide to said portion of a surface; and (c) heat treating said semiconductor body.

15. A method of fabricating an optical waveguide as recited in claim 14 wherein said portion of a surface of said semiconductor body associated with portions of said quantum well heterostructure adjoining said selected portion and said portions of said quantum well heterostructure adjoining said selected portion are in substantial correspondence with one another in a plan projection.

16. A method of fabricating an optical waveguide as recited in claim 14 wherein said heat treating brings about disordering in said quantum well heterostructure region, said disordering being substantial in said portions of said quantum well heterostructure adjoining said selected portion and being negligibly small in said selected portion of a quantum well heterostructure region.

17. A method of fabricating an optical waveguide as recited in claim 16 wherein said sputter etch is an argon sputter etch.

* * * * *

UNITED STATES PATENT AND TRADEMARK OFFICE
CERTIFICATE OF CORRECTION

PATENT NO. : 4,990,466

DATED : February 5, 1991

INVENTOR(S) : Shieh et al.

It is certified that error appears in the above-identified patent and that said Letters Patent is hereby corrected as shown below:

ON THE TITLE PAGE

Section (75)
Change "Joseph I. Mantz" to read --Joseph L. Mantz--; and
Change "Reinhard" to read --Reinhart--.

Section (56)
Line 23 thereof: change "Sames" to read --Sams--.

Section (57)
Line 3: change "semiconducotr" to read --semiconductor--.

Column 6
Line 31: change "bolts" to read --volts--.

Signed and Sealed this

Nineteenth Day of May, 1992

Attest:

DOUGLAS B. COMER

*Attesting Officer*  *Acting Commissioner of Patents and Trademarks*